July 26, 1966 H. W. O'FARRELL 3,262,694

SOLAR CELL MODULE ASSEMBLY JIG

Filed June 10, 1963 4 Sheets-Sheet 1

INVENTOR.
HERBERT W. O'FARRELL
BY
E. Hayward Marshall
AGENT

July 26, 1966 H. W. O'FARRELL 3,262,694

SOLAR CELL MODULE ASSEMBLY JIG

Filed June 10, 1963 4 Sheets-Sheet 2

INVENTOR.
HERBERT W. O'FARRELL
BY
E Hayward Marshall
AGENT

July 26, 1966 H. W. O'FARRELL 3,262,694

SOLAR CELL MODULE ASSEMBLY JIG

Filed June 10, 1963 4 Sheets-Sheet 3

INVENTOR.
HERBERT W. O'FARRELL
BY
E Hayward Marshall
AGENT

July 26, 1966 H. W. O'FARRELL 3,262,694

SOLAR CELL MODULE ASSEMBLY JIG

Filed June 10, 1963 4 Sheets-Sheet 4

INVENTOR.
HERBERT W. O'FARRELL
BY
E Hayward Marshall
AGENT

United States Patent Office 3,262,694
Patented July 26, 1966

3,262,694

SOLAR CELL MODULE ASSEMBLY JIG

Herbert W. O'Farrell, Torrance, Calif., assignor, by mesne assignments, to TRW Inc., a corporation of Ohio Filed June 10, 1963, Ser. No. 286,824
9 Claims. (Cl. 269—153)

This invention relates to the manufacture of solar cell modules and more particularly to a jig for assembling, positioning and maintaining the components under resilient pressure, while the entire assembly and the jig is subjected to heat for simultaneously soldering all of the various circuit connections, as well as structurally bonding the layers into a strong light weight structure which minimizes the tendency of the solar cells to crack and the other components and electrical connections to fracture.

Previous solar cell module assemblies were made by hand soldering the various circuit connecting wires and mounting the solar cells on a substrate with some form of cement.

The assembly jig of the present invention is particularly useful in manufacturing the All Solder Solar Cell Module Assembly disclosed in the copending application of Herbert W. O'Farrell, Ser. No. 286,791, filed June 10, 1963, but may be utilized for numerous other solar cell arrays, and may be modified for other sizes, shapes and unique arrangements of solar cells.

Briefly stated, one preferred embodiment of the present invention consists essentially of a frame which serves as a support and also as a guide for a pressure foot spring bolster which may be raised and lowered by a pair of handle actuated cams. A plurality of springs mounted in the spring bolster engage a plurality of pressure feet which are mounted for limited movement in a carrier. The pressure feet and the carrier provide thin flanges and strips which provide a gridded surface corresponding to the desired solar cell array.

A pressure plate resiliently engages the solar cell module assembly and is held on the framework by four swivel bolts having springs which urge the pressure plate towards the frame.

In the operation of the present invention the handle actuated cams are rotated to release the spring pressure on the pressure feet and the individual solar cells are positioned on their respective pressure feet, after the connecting strips have been inserted in slots provided therefor in each row of the pressure feet. A printed circuit board is next laid on top of the array of solar cells and a substrate is laid on top of the printed circuit board with a layer of either metallic solder or suitable cement therebetween. The pressure plate is laid on top of the substrate in position on top of the frame and the swivel bolts are tightened to resiliently urge the pressure plate towards the solar cell assembly.

After the handles have been rotated to engage the cams against the spring bolster and urge the pressure feet upwardly against each individual solar cell, the entire assembly in the jig is put in an oven, where it may be heated by hot air or other means to a temperature and for a time sufficient to melt the solder and permit it to flow evenly and form all of the structural bonds and electrical connections required. Since all of the components as well as the solder are heated uniformly, the solder flows evenly and simultaneously and much of the thermal strain is relieved which would otherwise produce cracking or rupturing of electrical connections.

One object of the present invention is to provide an improved assembly jig for solar cell modules which reduces the time and cost of producing a solar cell array, and also produces a stronger, lighter weight, solar cell module which minimizes the thermal strain which often resulted in cracking of the solar cell or breaking of electrical circuit connections between various solar cells, as well as improving the electrical and thermal conductivity between the components of the solar cell module.

Other objects and many of the attendant advantages of this invention will be readily appreciated as the same becomes better understood by reference to the following detailed description when considered in connection with the accompanying drawings wherein.

Figure 1:
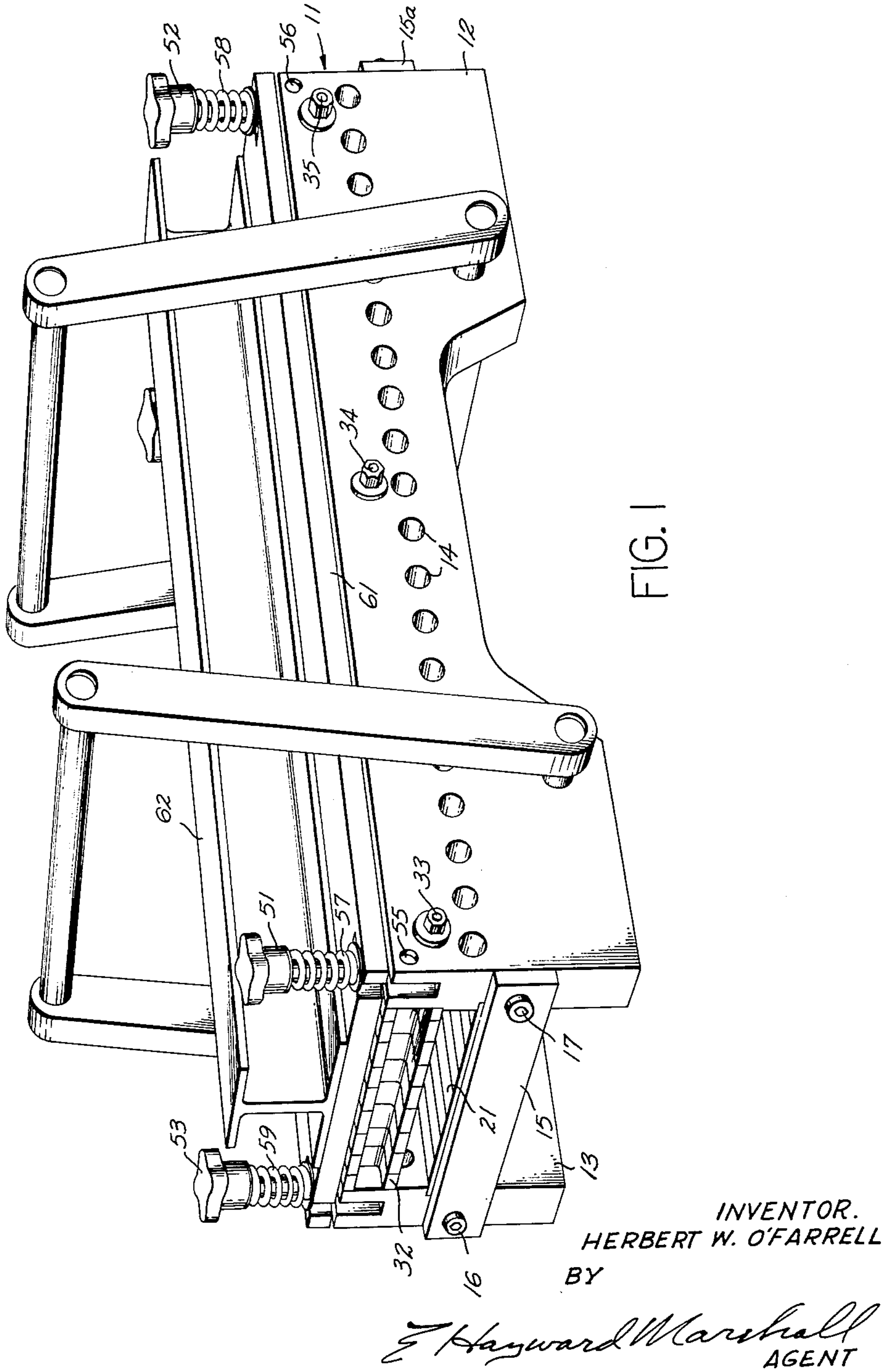
FIG. 1 is a pictorial view illustrating one preferred embodiment of the solar cell module assembly jig of the present invention.

Referring now to the drawings in detail and more particularly to FIG. 1, one preferred embodiment of the solar cell module assembly jig of the present invention is illustrated wherein the main frame means 11 consists of two side plates 12 and 13 provided with a plurality of openings 14 therethrough to facilitate the circulation of hot air through the jig for more uniform heating, and also the subsequent cooling, of the jig and the solar cell module.

The two side plates 12 and 13 are joined together by the end plates 15 and 15*a* joined thereto by cap screws such as those shown at 16 and 17 in FIG. 1.

Figures 2, 3:
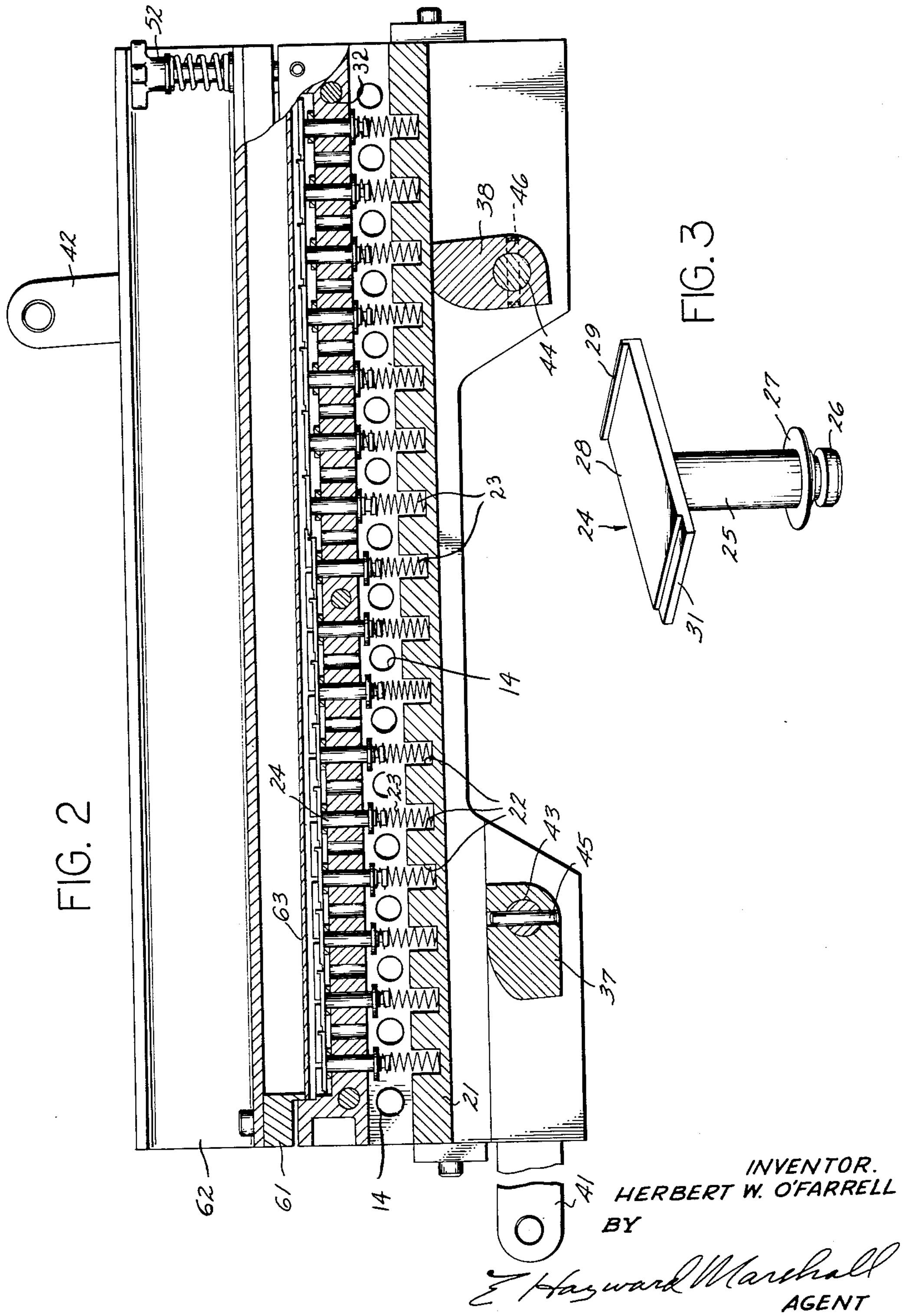
FIG. 2 is a longitudinal sectional view of the assembly jig of FIG. 1.
FIG. 3 is a detailed view on a large scale of a pressure foot for supporting the individual solar cell.
Figure 4:
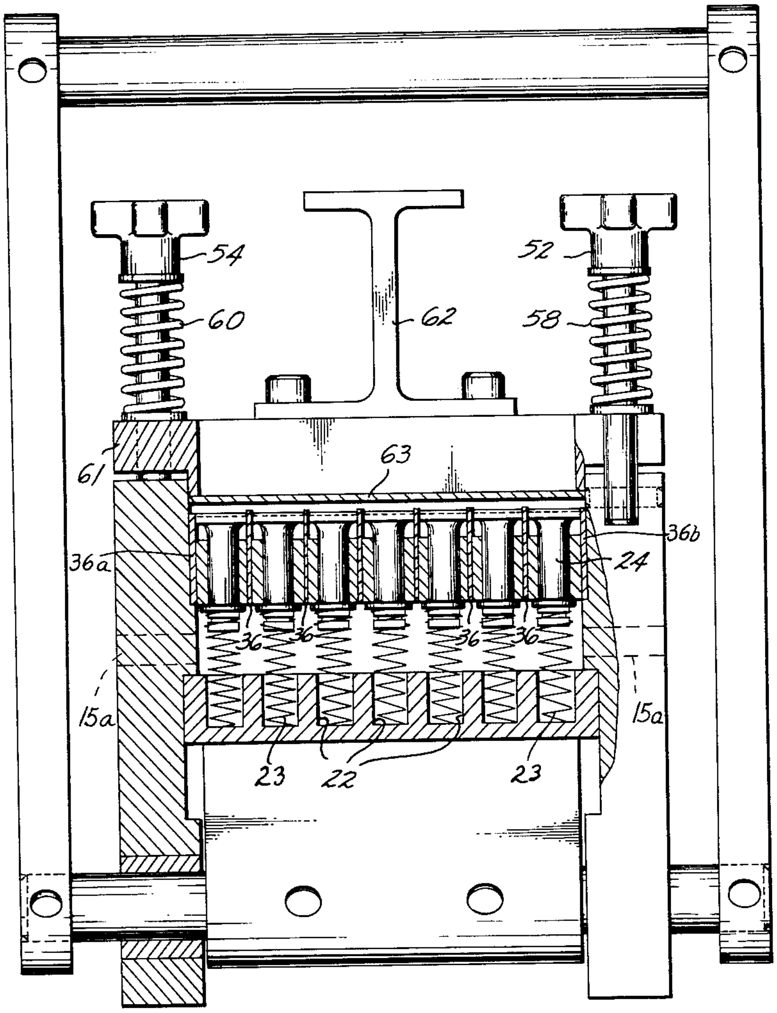
FIG. 4 is a transverse sectional view through the assembly jig of FIGS. 1 and 2.

These end plates 15 and 15*a* also serve as a guide for the pressure foot spring bolster 21 which is preferably provided with a plurality of cylindrical recesses 22 as shown in FIGS. 2 and 4 for receiving the spring 23, each of which engages the bottom or the lower end of a pressure foot 24.

The pressure foot 24 is shown in more detail on an enlarged scale in FIG. 3 and consists of a cylindrical shank 25 terminating at an end portion 26 which is engaged by the spring 23. A washer or retainer disc 27 limits the upward movement of the pressure foot 24. The upper end of the pressure foot 24 carries a rectangular supporting plate 28 which has an upwardly extending flange 29 at one end thereof for positioning the solar cell thereon, the solar cell being of the same shape and size as the plate 28. A lip 31 on the other end of the plate 28 formed by a reduced thickness portion of the plate 28 forming a slot means with the rest of the plate 28 and the end of the next plate 28 adjacent said reduced thickness portion serves to support a current carrying connector strip in a manner to be described subsequently in conjunction with FIG. 5.

A carrier 32 is provided with a plurality of parallel cylindrical openings therethrough for mounting a pressure foot with limited axial movement therein.

The pressure foot carrier 32 preferably consists of a plurality of long narrow strips laminated together between the side plates 12 and 13 and held in position by the transverse bolts 33, 34 and 35. As shown in FIG. 4, these strips or sections which form the pressure foot carrier are separated by very thin notched strips, such as those shown at 36, which serve to separate the solar cells during assembly in the jig and properly position the solar cells in the array.

The two cams 37 and 38 are operated by the cam actuating handles 41 and 42, with the handle 41 shown in the open or disengaged position for cam 37, and handle 42 being shown in the closed or engaged locking position of the cam 38 against the pressure foot spring bolster 21.

As indicated on the right hand side of FIG. 2, the closed position of the cam 38 moves the spring bolster 21 upwardly and presses the pressure feet 24 upwardly into the position shown, until the retainer washer 27 engages the bottom of the pressure foot carrier 32. As indicated on the left hand side of FIG. 2, when the handle 41 is in the lower position with the cam 37 disengaged the pressure feet are permitted to drop down into the position shown for inserting the solar cells into the jig in a manner to be described in conjunction with FIG. 5.

The cams 37 and 38 are mounted on transverse shafts 43 and 44 and are retained on the shafts by pins 45 and 46.

The side plates 12 and 13 also serve to mount the swivel bolts 51, 52, 53 and 54 at each corner thereof on pins such as those shown at 55 and 56 in FIG. 1.

These swivel bolts are provided with springs 57, 58, 59 and 60 which resiliently engage the top of the pressure plate 61 which is reinforced and made more rigid by beam 62. The pressure plate 61 is provided with a thin flat reinforcing plate 63 which actually engages the substrate in the solar cell module assembly.

As shown in FIG. 4, two plates **36*a* and 36*b* are provided to engage the ends of the current carrying connector strips which are resiliently urged downwardly against the plates 36*a* and 36*b* by plate 63 under pressure from springs 57, 58, 59 and 60**.

Figure 5:
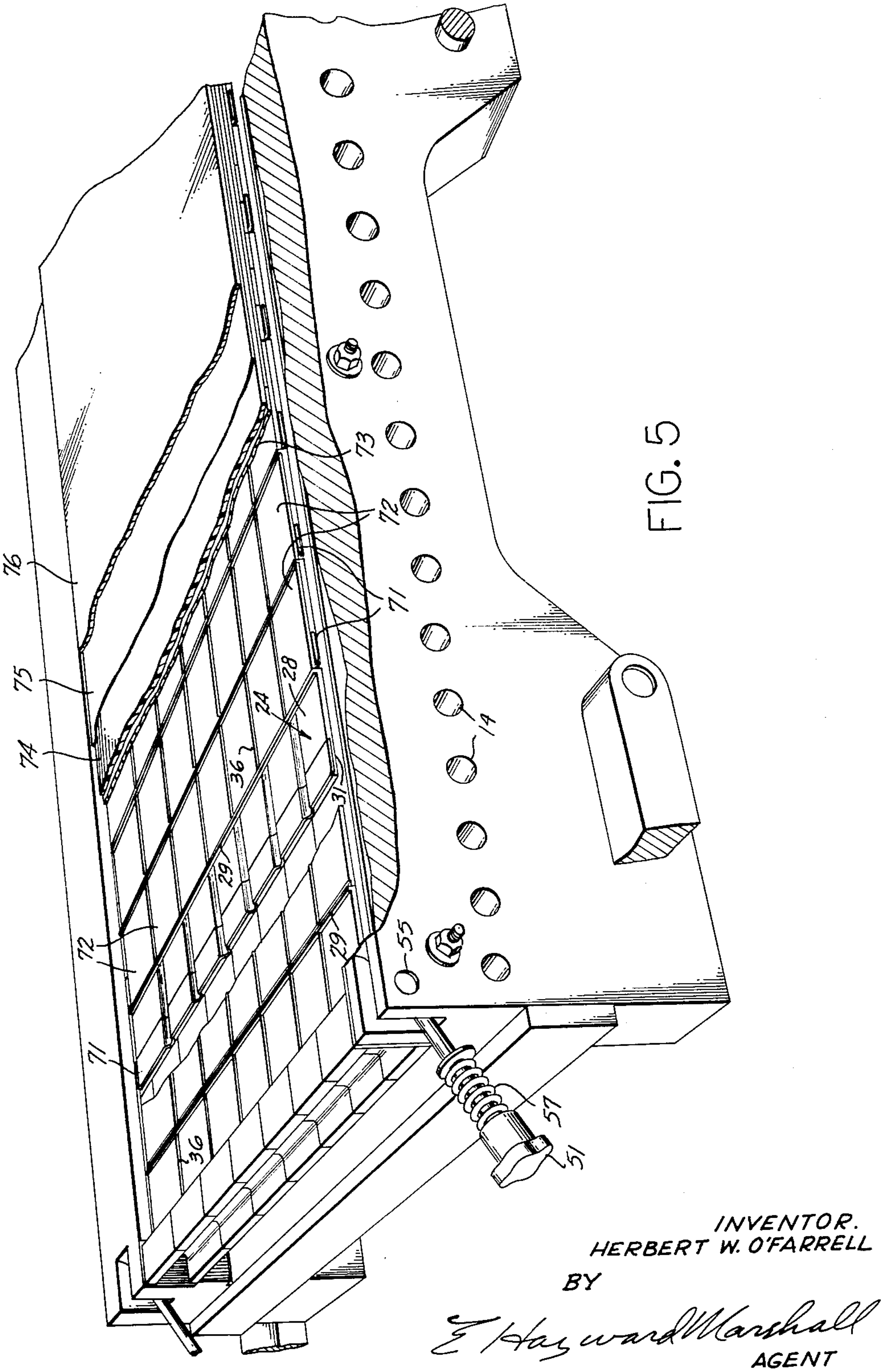
FIG. 5 is a pictorial view of the assembly jig of FIGS. 1, 2 and 3 with the pressure plate removed and with portions of the solar cell assembly broken away and shown in position to illustrate the sequential loading of the jig.

The use of the jig is clearly illustrated in FIG. 5 wherein the pressure plate 61 has been removed and portions have been broken away to show the sequential loading of the jig and the various layers or laminations that make up the completed solar cell assembly.

The jig shown in the present application may be utilized for assembly of the solar cell module described and claimed in the copending application of Herbert W. O'Farrell for All Soldered Solar Cell Module Assembly, but may obviously be redesigned or arranged in a different manner and adapted for the assembly and manufacturing of substantially any solar cell assembly or a similar assembly of components of the same general nature.

In FIG. 5, the first two rows show the pressure feet in the lower position with separators guide means 36 slightly above the under surface of each pressure foot, and in the second row the pressure feet are partially broken away to illustrate the manner in which a connecting strip 71 is inserted in the slot means provided therefor in each row of the pressure feet. The subsequent row shows a series of solar cells 72 positioned on top of the pressure feet with separator guide means 36 and the flanges 29 properly positioning each of the solar cells 72.

Beyond the two rows of solar cells 72 are the various layers broken away and shown in section which are subsequently laid on top of the solar cells before the pressure plate 61 is mounted and tightened down.

The first layer 73 is the tinned copper circuit pattern which is etched or otherwise provided on the epoxy circuit board 74. The next layer is the bonding cement on the epoxy board 74 by which it is bonded to the substrate 76.

After these various layers have been properly positioned in the jig, the pressure plate 61 is mounted in position on the side plate 12 and 13 and tightened down by means of the swivel screws 51, 52, 53 and 54 with the springs 57, 58, 59 and 60 maintaining a resilient pressure through the plate 63 against the substrate or mounting board 76 which holds the various components of the solar cell module in assembled relation.

The handles 41 and 42 are then rotated to their upper position, such as that shown for both handles in FIG. 1 and for the handle 42 in FIG. 2 with the cams 37 and 38 engaging the bottom of the spring bolster 21 which resiliently urges each one of the pressure feet against the solar cell holding each one individually and resiliently against the epoxy circuit board 74.

In the use of the assembly jig of the present invention, after the solar cell module or the components thereof have been assembled as described above, the whole jig containing the solar cell module in assembled relation is placed in an oven, where it may be heated by hot air other means to a temperature which is sufficient to melt the solder between the solar cells and the epoxy board, as well as the solder or other bonding material between the epoxy board and the substrate 76. The jig and assembly are left in the oven for a time sufficient to permit a flow of the molten solder and an even distribution thereof, and then is permitted to cool in the oven or removed to cool to ambient temperature.

Of course the jig of the present invention may also be used for similar assemblies which utilize an epoxy cement or other bonding material for the layer 75 between the printed circuit board 74 and 76 which is settable or cured with best results under the heat and pressure.

Obviously, many other modifications and variations of the present invention may be made within the scope of the following claims.

The embodiments of the invention is which an exclusive property or privilege is claimed are defined as follows:

1. A solar cell module assembly jig comprising:
(A) a frame;
(B) a spring bolster moveably mounted in said frame;
(C) a carrier mounted in said frame in spaced relation to said bolster;
(D) a plurality of pressure feet mounted for limited movement in said carrier;
(E) resilient means mounted between each of said pressure feet and said spring bolster;
(F) cam means mounted on said frame and engaging said bolster for resiliently urging said pressure feet in one direction.

2. A solar cell module assembly jig comprising:
(A) a frame;
(B) a spring bolster moveably mounted in said frame;
(C) a carrier mounted in said frame in spaced relation to said bolster;
(D) a plurality of pressure feet mounted for limited movement in said carrier;
(E) resilient means mounted between each of said pressure feet and said spring bolster;
(F) cam means mounted on said frame and engaging said bolster for resiliently urging said pressure feet in one direction;
(G) a pressure plate removeably mounted on said frame in spaced relation to said carrier.

3. A solar cell module assembly jig comprising:
(A) a frame;
(B) a spring bolster moveably mounted in said frame;
(C) a carrier mounted in said frame in spaced relation to said bolster;
(D) a plurality of pressure feet mounted for limited movement in said carrier;
(E) resilient means mounted between each of said pressure feet and said spring bolster;
(F) cam means mounted on said frame and engaging said bolster for resiliently urging said pressure feet in one direction;
(G) a pressure plate removeably mounted on said frame in spaced relation to said carrier; and
(H) resilient means for holding said pressure plate on said frame.

4. A solar cell module assembly jib comprising:
(A) a frame;
(B) a spring bolster moveably mounted in said frame;
(C) a carrier mounted in said frame in spaced relation to said bolster;

(D) a plurality of pressure feet mounted for limited movement in said carrier;

(E) a spring mounted between each of said pressure feet and said spring bolster:

(F) cam means mounted on said frame and engaging said bolster for resiliently urging said pressure feet in one direction;

(G) a pressure plate removeably mounted on said frame in spaced relation to said carrier; and (H) resilient means for holding said pressure plate on said frame.

5. A solar cell module assembly jig as set forth in claim 4 wherein:

(A) means is provided for positioning a solar cell with respect to each pressure foot for forming a particular array.

6. A solar cell module assembly jig as set forth in claim 4 wherein:

(A) guide means is provided for positioning solar cells with respect to said pressure feet for forming a solar cell array; and (B) a reduced thickness portion is provided along each of said pressure feet forming a slot means with the rest of the foot and the end of the next foot adjacent said reduced thickness portion for positioning each current carrying connector strip with respect to its related solar cells.

7. A solar cell module assembly jig as set forth in claim 4 wherein:

(A) guide means is provided for positioning solar cells with respect to said pressure feet for forming a solar cell array;

(B) a reduced thickness portion is provided along each of said pressure feet forming a slot means with the rest of the foot and the end of the next foot adjacent said reduced thickness portion for positioning each current carrying connector strip with respect to its related solar cells;

(C) frame means is provided for positioning a circuit board and substrate with respect to the array of solar cells.

8. A solar cell module assembly jig as set forth in claim 4 wherein:

(A) each of said pressure feet is provided with flange and said carrier is provided with strips between adjacent pressure feet for positioning solar cells in a particular array.

9. A solar cell module assembly jig as set forth in claim 4 wherein:

(A) each of said pressure feet is provided with flange and said carrier is provided with strips between adjacent pressure feet for positioning solar cells in a particular array; and (B) a reduced thickness portion is provided along each of said pressure feet forming a slot means with the rest of the foot and the end of the next foot adjecent said reduced thickness portion for positioning each current carrying connector strip with respect to its related solar cells.

References Cited by the Examiner

UNITED STATES PATENTS

| | | | |
|---|---|---|---|
| 1,167,418 | 1/1916 | Lennon | 269—37 X |
| 3,064,715 | 11/1962 | Bland | 269—42 |

ROBERT C. RIORDON, *Primary Examiner.*

F. J. POWERS, B. S. MOWRY, *Assistant Examiners.*